United States Patent [19]

Shibata

[11] Patent Number: 5,168,342
[45] Date of Patent: Dec. 1, 1992

[54] SEMICONDUCTOR INTEGRATED CIRCUIT DEVICE AND MANUFACTURING METHOD OF THE SAME

[75] Inventor: Manabu Shibata, Takasaki, Japan

[73] Assignee: Hitachi, Ltd., Chiyoda, Japan

[21] Appl. No.: 707,974

[22] Filed: May 23, 1991

Related U.S. Application Data

[63] Continuation of Ser. No. 472,081, Jan. 30, 1990, abandoned.

[30] Foreign Application Priority Data

Jan. 30, 1989 [JP] Japan .................................. 1-20380

[51] Int. Cl.⁵ ...................... H01L 21/82; H01L 27/08
[52] U.S. Cl. .................................... 257/210; 257/211
[58] Field of Search .................. 357/68, 45, 45 M, 71

[56] References Cited

U.S. PATENT DOCUMENTS

| 4,682,207 | 7/1987 | Lipp | 357/45 |
| 4,748,488 | 5/1988 | Suzuki et al. | 357/40 |
| 4,777,606 | 10/1988 | Fournier | 357/45 |
| 4,780,753 | 10/1988 | Ohkura et al. | 357/45 |
| 4,833,520 | 5/1989 | Ito et al. | 357/45 |
| 4,849,932 | 7/1989 | Yoneza | 357/40 |
| 4,868,630 | 9/1989 | Tanizawa | 357/45 |
| 4,870,300 | 9/1989 | Nakaya et al. | 357/45 |
| 4,884,115 | 11/1989 | Michel et al. | 357/45 |
| 4,947,233 | 8/1990 | Aso | 357/65 |
| 4,949,157 | 8/1990 | Mirami | 357/45 |

FOREIGN PATENT DOCUMENTS

| 57-133651 | 8/1982 | Japan . | |
| 58-51537 | 3/1983 | Japan . | |
| 58-139445 | 8/1983 | Japan . | |
| 58-164243 | 9/1983 | Japan . | |
| 60-140842 | 7/1985 | Japan . | |
| 62-54450 | 3/1987 | Japan . | |
| 63-53948 | 3/1988 | Japan . | |
| 63-187647 | 8/1988 | Japan | 357/45 |

Primary Examiner—Andrew J. James
Assistant Examiner—Viet Q. Nguyen
Attorney, Agent, or Firm—Antonelli, Terry, Stout & Kraus

[57] ABSTRACT

In a semiconductor integrated circuit device adopting a master slice system, a plurality of lattice points of an X-Y lattice-shaped channel region set by an automatic arrangement and routing system correspond to one input/output terminal of a prescribed basic cell (or logic circuit), thereby a plurality of signal wirings can be connected to the one input/output terminal.

6 Claims, 5 Drawing Sheets

SEMICONDUCTOR INTEGRATED CIRCUIT DEVICE AND MANUFACTURING METHOD OF THE SAME This application is a continuation of application Ser. No. 07/472,081, filed Jan. 30, 1990 now abandoned.

BACKGROUND OF THE INVENTION

The present relates to a semiconductor integrated circuit device, and more particularly to effective technology to be applied to a semiconductor integrated circuit device adopting a master slice system.

A gate array is a typical example of a semiconductor device adopting a master slice system. The gate array is provided with a plurality of basic cells arranged regularly in matrix form on a semiconductor substrate, and connection is performed in each basic cell and between basic cells by plural layers of wiring. Each basic cell of the gate array developed by the present inventor has bipolar transistors and complementary MOSFETS. A semiconductor integrated circuit device adopting such master slice system can constitute various logic circuits by only changing the wiring patterns in each basic cell and between basic cells. In other words, the semiconductor integrated circuit device is characterized in that various sorts of LSI can be developed in a short period.

In the semiconductor integrated circuit device adopting the master slice system, the wiring patterns to perform connection in each basic cell and between basic cells respectively are determined by the automatic arrangement and routing system of design automation (DA or CAD : Computer Aided Design) using a computer. The automatic arrangement and routing system receives logic connection information (wiring information) prepared based on logic specification of LSI to be produced and has the function of automatically generating (producing) the wiring pattern to perform connection in each basic cell and between basic cells respectively in X-Y lattice-shaped wiring channel region. The X-Y lattice-shaped wiring channel region is a wiring channel region set imaginarily (temporarily) in the memory space of the automatic arrangement and routing system. The X-Y lattice-shaped wiring channel region is composed of a plurality of the X wiring channel regions with signal wirings of the first layer extended imaginarily in the X direction and of a plurality of Y wiring channel regions with signal wirings of the second layer extended imaginarily in the Y direction respectively arranged in lattice form. Each lattice point of the X-Y lattice-shaped wiring channel region is used as a connection position for connecting signal wirings of the first and second layers to each other or a connection position for connecting an input/output terminal of a basic cell to the signal wiring.

In such semiconductor integrated circuit device adopting the master slice system, since all usable wiring paths are clearly defined as the X-Y lattice-shaped channel region, processing function of the software of the automatic arrangement and routing system can be simplified thereby the semiconductor integrated circuit device is suitable for the design automation.

According to the automatic arrangement and routing system, the wiring pattern information automatically generated in the X-Y lattice-shaped wiring channel region becomes information for generating a manufacturing mask to be used in the manufacturing process. According to the manufacturing mask generated by the information, each of the actual signal wirings formed on the semiconductor wafer (basic chip) has the wiring width or the wiring film thickness previously determined in consideration of the current capacity of the signal wiring or electromigration.

If the manufacturing mask is generated, the LSI manufacturing process (device process) is performed using the manufacturing mask. The LSI manufacturing process is processing where signal wirings are needed to perform connection in each of a plurality of basic cells previously formed and between the basic cells on the semiconductor wafer (basic chip). An aluminum wiring is used as the signal wiring.

A semiconductor integrated circuit device adopting the master slice system with basic cells constituted by bipolar transistors and complementary MOSFETs is disclosed, for example, in Denshi Zairyo (Electronic Material) July 1987, pp. 49-52, published by K. K. "Kogyo Chosakai".

Also Japanese patent application laid-open No. 182540/1984 discloses technology in a semiconductor integrated circuit device adopting the master slice system wherein an exclusive channel is allocated for a wiring pattern connecting between terminals of a basic cell relatively remote among a plurality of basic cells formed previously on a semiconductor wafer, or for a clock signal wiring pattern whereby delay is decreased in the logic. The laid-open application also discloses that in order to make the effect as the exclusive channel larger, the width of the wiring pattern allocated on the exclusive channel may be made wider than that of the wiring pattern allocated on other ordinary channels.

SUMMARY OF THE INVENTION

In the semiconductor integrated circuit device adopting the master slice system, the present inventor has found the following problems.

As the semiconductor integrated circuit device becomes large scale (large scale of the logic gate), in some cases, a driver circuit of a clock system drives a number of logic circuits. In such case, in order to raise the electromigration resistant property of the signal wiring, the current capacity of the signal wiring for connecting the driver circuit of the clock system with a plurality of logic circuits must be increased. That is, the width of the signal wiring must be made large.

In general, in a semiconductor integrated circuit device adopting the master slice system, all signal wirings except for the power source wiring are formed based on the same design rule (the same width, the same wiring pitch). This is performed to simplify the processing function of the automatic arrangement and routing system and to facilitate the design automation. If the width of the signal wirings is made large in order to raise the electromigration resistant property of a specific signal wiring, in all signal wirings having the large width, connection is performed between all basic cells or between the logic gates. Consequently, since the number of the signal wirings per unit area which can be installed on the base chip is decreased (the wiring path usable per unit area is decreased), the freedom of the wiring is deteriorated. The deterioration of the freedom of the wiring causes a decrease of the mounting rate of the logic circuits (decrease of the use efficiency of the basic cells). That is, the integration degree of the semiconductor integrated circuit device adopting the master slice system is decreased.

According to the results of study by the inventor, a portion of the signal wiring where the width of the signal wiring must be made large (critical path portion) is only several % of the area occupied by all signal wirings installed on the base chip.

In the technology disclosed in the Japanese patent application laid-open No. 182540/1984 as above described, since a plurality of exclusive channels are previously allocated on the base chip at random, a problem of the deterioration of the freedom of the wiring still remains and the large scale of the logic gate cannot be dealt with sufficiently.

An object of the invention is to provide technology where the operation speed is made high and a high integration (improvement of use efficiency of the cell) is attainable in a semiconductor integrated circuit device adopting a master slice system.

Another object of the invention is to provide technology where the above object can be attained efficiently using the automatic arrangement and routing system.

The foregoing and other objects and the novel features of the invention will be apparent from the description of the specification and the accompanying drawings.

Outline of the typical invention disclosed in the present application will be briefly described as follows.

In a semiconductor integrated circuit device adopting a master slice system, a plurality of lattice points in the X-Y lattice-shaped wiring channel region set by the automatic arrangement and routing system face to the position corresponding to one input/output terminal of the prescribed basic cell (or logic circuit) whereby a plurality of signal wirings are connected to one input-/output terminal.

Also a method of forming a semiconductor integrated circuit device adopting master slice system comprises the step of setting the X-Y lattice-shaped wiring channel with a plurality of lattice points facing to the position corresponding to the input/output terminal of each basic cell (or logic circuit) onto the memory space of the automatic arrangement and routing system imaginarily; the step of inputting information for connecting between the respective basic cells with signal wirings and information for connecting the prescribed basic cells (or logic circuits) by a plurality of wirings into the automatic arrangement and routing system; the step of generating signal wiring patterns in the X-Y lattice-shaped wiring channel region set by the automatic arrangement and routing system; and the step of forming the actual signal wirings connecting the respective basic cells (or logic circuits) onto the semiconductor substrate based on the signal wiring patterns generated in the X-Y lattice-shaped wiring channel region set by the automatic arrangement and routing system.

According to the above-mentioned constitution, since a plurality of signal wirings can be connected to one input/output terminal of the prescribed basic cell (or logic circuit), the current capacity of the desired signal wiring can be large. Consequently, since large current can flow in the desired signal wiring, the operation speed of the semiconductor integrated circuit device adopting the master slice system can be made high. Single signal wiring is connected to the input/output terminal of the basic cell (or logic circuit) other than the prescribed basic cell (or logic circuit), whereby the number of the signal wirings per unit area on the base chip (the usable wiring path) can be increased, the manufacturing efficiency of the basic cell (logic circuit) can be raised and the high integration can be attained.

Also according to the above-mentioned method, since the X-Y lattice-shaped wiring channel region with a plurality of lattice points facing to the position corresponding to the input/output terminal of each basic cell (or logic circuit) is set, only the desired signal wirings regarding the same signal can be formed by a plurality of wirings without deteriorating the freedom of the wiring and without complicating the logic function of the automatic wiring and routing system. Consequently, the high speed and the high integration can be simultaneously achieved in the semiconductor integrated circuit device adopting the master slice system.

DESCRIPTION OF PREFERRED EMBODIMENTS

Figure 1:
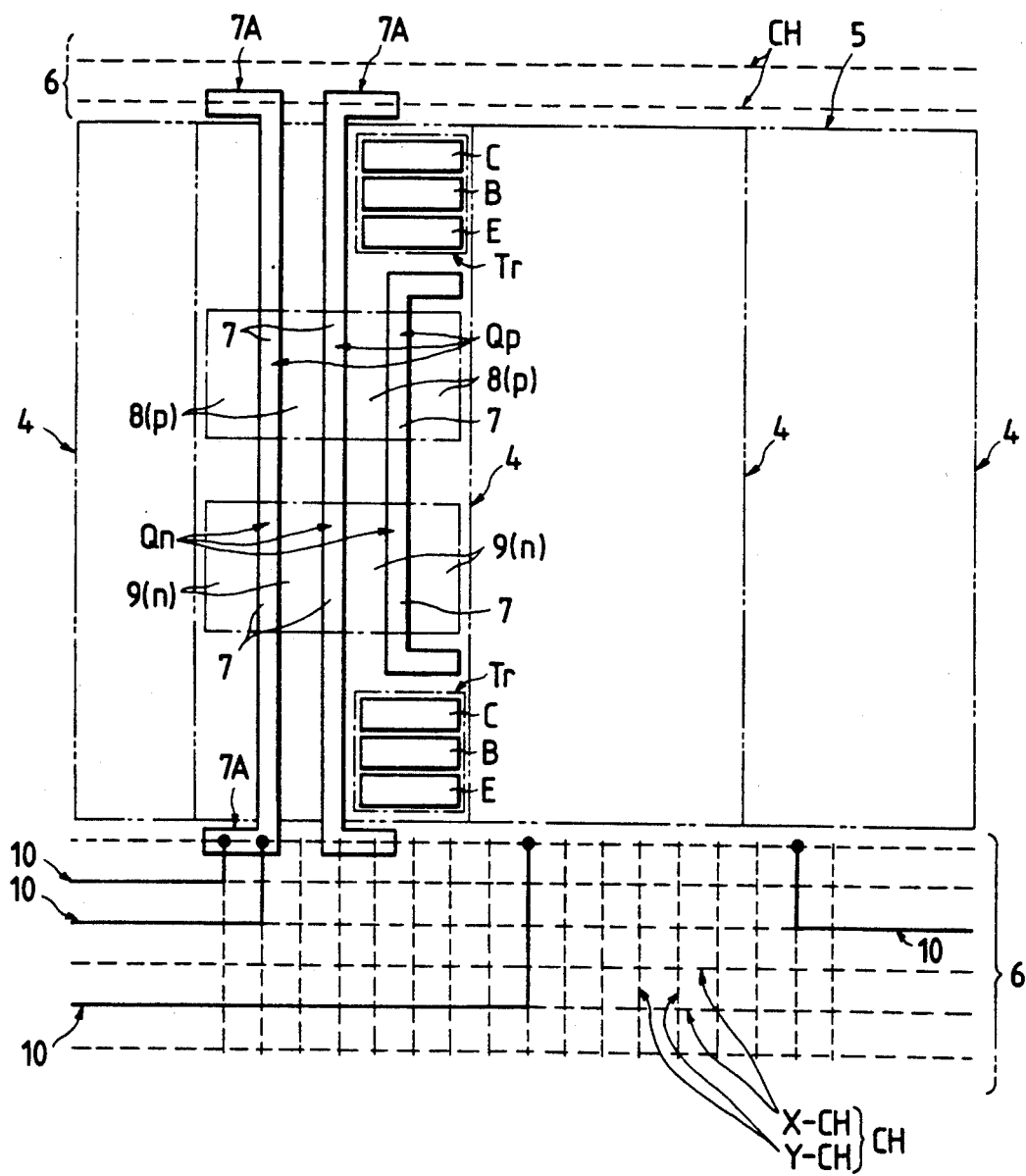
FIG. 1 is a plan view of a main part showing a basic cell and its peripheral region of a semiconductor integrated circuit device having a gate array system according to an embodiment of the invention.

The present invention will now be described with an embodiment where the invention is applied to a semiconductor integrated circuit device having a gate array system of the fixed channel type.

In all figures illustrating the embodiment, parts having the same function are designated by the same reference numerals and the repeated description shall be omitted.

Figure 2:
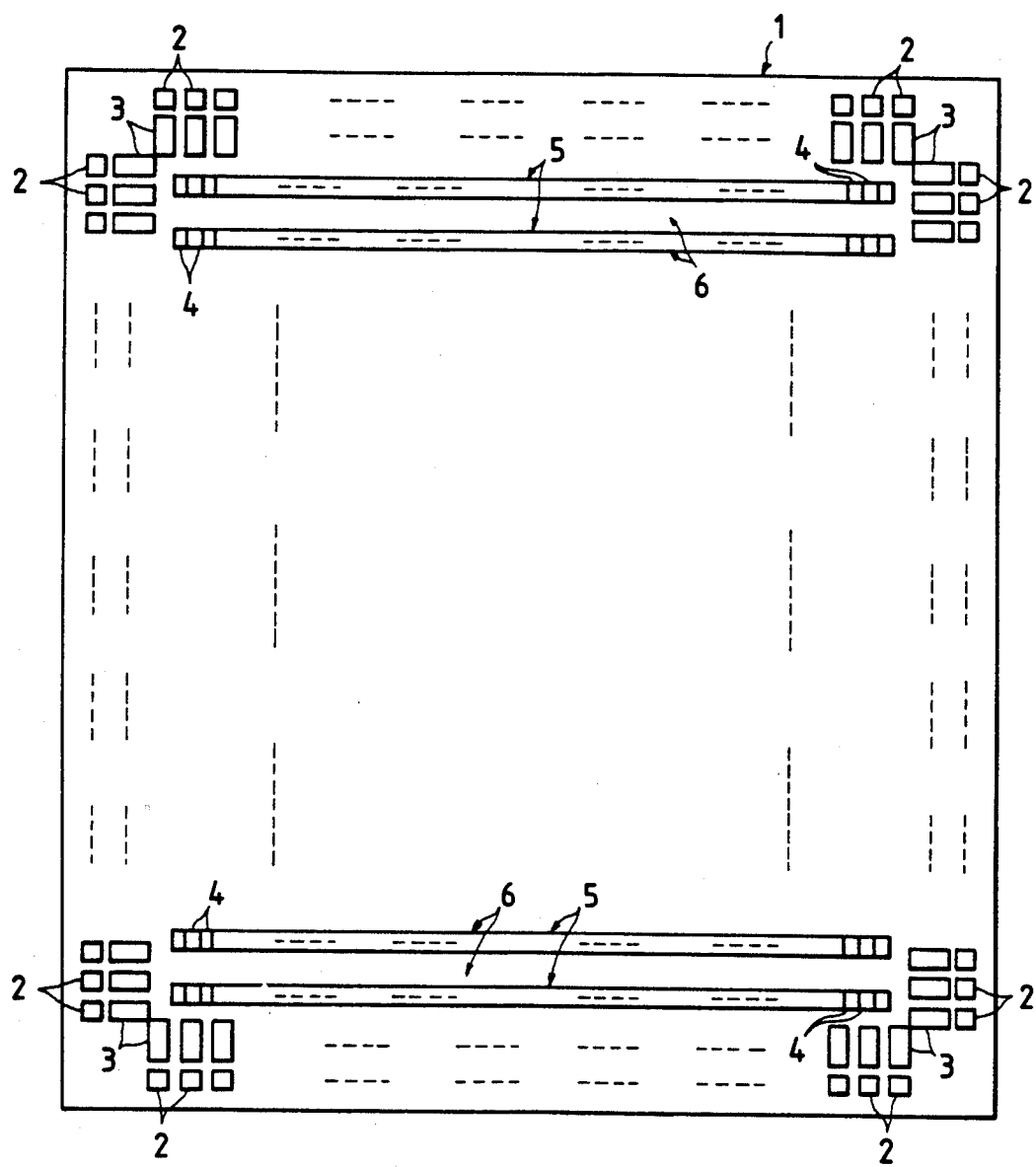
FIG. 2 is a schematic chip layout diagram of the semiconductor integrated circuit device of FIG. 1.

The basic schematic constitution of a semiconductor integrated circuit device having a gate array system according to an embodiment of the invention is shown in FIG. 2 (chip array diagram).

As shown in FIG. 2, the semiconductor integrated circuit device comprises a gate array system on a main surface of a chip 1 (e.g., monocrystalline silicon substrate). The chip 1 is in the form of a square plane. The semiconductor integrated circuit device is provided with a plurality of external terminals (bonding pads) 2 and input/output buffer circuits 3 respectively on a peripheral portion along each side of the chip.

The semiconductor integrated circuit device in the illustrated embodiment has a two-layer wiring structure although it is not particularly limited thereto. Consequently, the external terminal 2 is formed in the same wiring layer as the wiring formed in the wiring forming process of the second layer (or/and the first layer). Each wiring formed in the wiring forming process is formed of aluminum or an aluminum alloy. The aluminum alloy wiring includes addition of Cu or Cu and Si. Cu is added mainly to reduce the influence of migration. Si is added mainly to reduce alloy spike.

The input/output circuits 3 are arranged to the inside of the chip 1 from their corresponding one (or plural) external terminal 2. Although the construction of the circuits 3 is not shown in detail, the input/output buffer circuits 3 are each constituted by a cell for an input buffer circuit and a cell for an output buffer circuit. The cell for the input buffer circuit is, for example, a complementary MISFET (CMOS) which is connected as the input buffer circuit by wiring formed mainly in the first layer wiring forming process. Also the cell for input buffer circuit is provided with a protective resistance element or a clamping MISFET so that a static electricity breakage preventing circuit is provided. The cell for the output buffer circuit is constituted by a complementary MISFET (CMOS) and a bipolar transistor, which are connected as the output buffer circuit by wiring formed mainly in the first layer wiring forming process. On the upper side of the input/output circuit 3 is extended the main power source wiring (not shown). The main power source wiring is composed of power source voltage wiring $V_{cc}$ and reference voltage wiring $V_{ss}$. The power source voltage wiring $V_{cc}$ is applied by, for example, the operation voltage, 5 volts, of the circuit. The reference voltage wiring $V_{ss}$ is applied by, for example, the ground potential, 0 volts, of the circuit. The power source voltage wiring $V_{cc}$ and the reference voltage wiring $V_{ss}$ respectively are formed during the second layer wiring forming process.

The center portion of the chip 1 surrounded by the input/output circuits 3 is provided with a basic cell array (logic circuit member) to form a logic circuit. The basic cell array comprises a plurality of basic cells 4 arranged regularly in matrix form. The plurality of basic cells 4 are arranged in the column direction (X direction), and constitute a basic cell column 5.

A plurality of basic cell columns 5 are arranged in the row direction (Y direction) through a wiring forming region (wiring channel region) 6. The wiring forming region 6 is a region to form signal wiring connecting the basic cells 4, i.e., between the logic circuits formed by the basic cells 4. The semiconductor integrated circuit device adopting the gate array system in the embodiment is a fixed channel type where the basic cell columns 5 and the wiring forming regions 6 are respectively fixed on the chip 1 as above described.

The basic cell 4 as shown in FIG. 1 (plan view of main part) is mainly constituted by a complementary MISFET (CMOS) and a bipolar transistor Tr. One basic cell 4 has three complementary MISFETS. That is, the basic cell 4 is constituted by three p-channel MISFETs Qp connected in series and three n-channel MISFETs Qn connected in series. The p-channel MISFETs Qp are each formed on the main surface of the n-type well region provided on the main surface of the chip 1 in the region surrounded by a field insulation film. The p-channel MISFETs Qp are each constituted mainly by a gate insulation film, a gate electrode 7, and a pair of p-type semiconductor regions 8 as a source region and a drain region. The gate electrode 7 is formed by a gate member forming process which precedes the wiring forming process. The gate electrode 7 is formed, for example, by a polycrystalline silicon film although not particularly limited thereto. The n-channel MISFET Qn is on the main surface of the p-type well region provided on the main surface of the chip 1. The n-channel MISFET Qn is constituted mainly by a gate insulation film, a gate electrode 7, and a pair of n-type semiconductor regions 9 as a source region and a drain region.

One basic cell 4 has two bipolar transistors Tr in addition to the complementary MISFETs as above described. Respective bipolar transistors Tr are constituted by an n-type collector region C, an p-type base region B and an npn type structure constituted by an n-type emitter region E. Although not shown in FIG. 2, one basic cell 4 is further provided with a resistance element (or/and a capacitance element).

Respective semiconductor elements of the basic cell 4 are connected usually by signal wiring formed in the wiring forming process of the first layer (wiring in the basic cell). Power source wiring (not shown) is extended in the column direction on the basic cell 4. The power source wiring is composed of power source voltage wiring $V_{cc}$ and reference voltage wiring $V_{ss}$. The power source wiring is connected to the main power source wiring extended on the input/output buffer circuit 3 or an auxiliary power source wiring (not shown) connected thereto and extended on the basic cell array. The power source wiring extended on the basic cell 4 is formed in the wiring forming process of the first layer.

An input signal terminal and an output signal terminal are provided on the basic cell 4 or the logic circuit formed by the basic cell 4. Terminals 7A provided on the end portion in the gate width direction of respective gate electrodes 7 of the p-channel MISFET Qp and the n-channel MISFET Qn are used as input signal terminals. The base region B of the bipolar transistor Tr is used as an input signal terminal. On the other hand, the p-type semiconductor region 8 of the p-channel MISFET Qp and the n-type semiconductor region 9 of the n-channel MISFET Qn respectively are used as output signal terminals. Collector region or emitter region of the bipolar transistor Tr is used as an output signal terminal.

FIG. 1 shows specific structure of the basic cell 4, and the state that the X-Y lattice-shaped wiring channel region CH set imaginarily (temporarily) in the memory space of the automatic arrangement and routing system is overlaid on the wiring region 6 for convenience. That is, the X-Y lattice-shaped wiring channel region CH does not actually exist in the semiconductor integrated circuit device adopting the gate array system, but is imaginarily set to the memory space of the automatic arrangement and routing system. The X-Y lattice-shaped wiring channel region CH is shown by broken line in FIG. 1. The X-Y lattice-shaped wiring channel region CH is composed of a plurality of X wiring channel regions X-CH extended in the column direction and arranged at regular intervals in the row direction, and a plurality of Y wiring channel regions Y-CH extended in the row direction and arranged at regular intervals in the column direction. Although not shown in FIG. 1, in addition to the wiring region 6, a part of the XY lattice-shaped wiring channel region CH is also imaginarily set as a wiring inhibiting region on the basic cell 4.

The signal wiring 10 mainly formed in the wiring forming process of the first layer is extended in the column direction specified by the X-Y lattice-shaped wiring channel region CH of the wiring region 6. The signal wiring mainly formed in the wiring forming process of the second layer is extended in the row direction specified by the wiring region 6 and the X-Y lattice-shaped wiring region CH of the basic cell 4.

Figure 3:
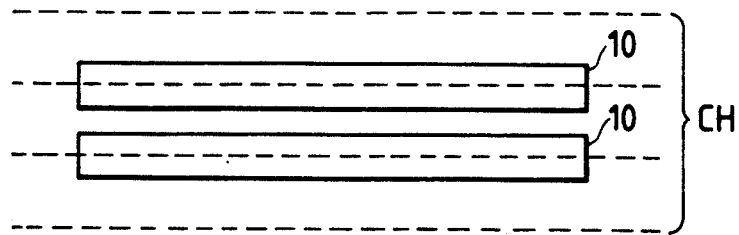
FIG. 3 is a plan view of a main part of the device of FIG. 1 showing signal wiring connecting between basic cells of the device.

In the position corresponding to the signal terminal 7A, the input signal terminal of the basic cell 4 or the logic circuit formed by the basic cell 4, a plurality of lattice points of the X-Y lattice-shaped wiring channel region CH are arranged in the memory space of the automatic arrangement and routing system. In the embodiment, in the position corresponding to one signal terminal 7A, there are two lattice points which are intersection points between one X wiring channel region X-CH and two Y wiring channel regions Y-CH. Each wiring channel region is so constituted that one signal wiring can be arranged therein. Each lattice point is a position that a connection hole for electric connection between signal wirings of the first and second layers or between a signal wiring and the input/output signal terminal can be arranged. That is, two signal wirings 10 which are simplified and shown by solid lines in FIG. 1 can be connected to the signal terminal 7A. The actual signal wiring (signal wiring formed in the wiring forming process of the first layer) 10 is constituted as shown in FIG. 3 (plan view of main part). The signal wiring 10 is formed in prescribed wiring width as a result that the worst case to some degree is assumed and prescribed current capacity or electromigration resistant property is considered based on the power consumed in the basic cell 4 (or logic circuit). For example, the signal wiring 10 is formed with the film thickness of about 1 $\mu$m and the wiring width of 2-4 $\mu$m. The signal wiring 10 having substantially the same film thickness and the same wiring width is arranged in each wiring channel region. Although not shown, input signal terminals and output signal terminals other than the signal terminal 7A of the basic cell 4 are also provided to enable the connection of a plurality of signal wirings 10.

Figure 4:
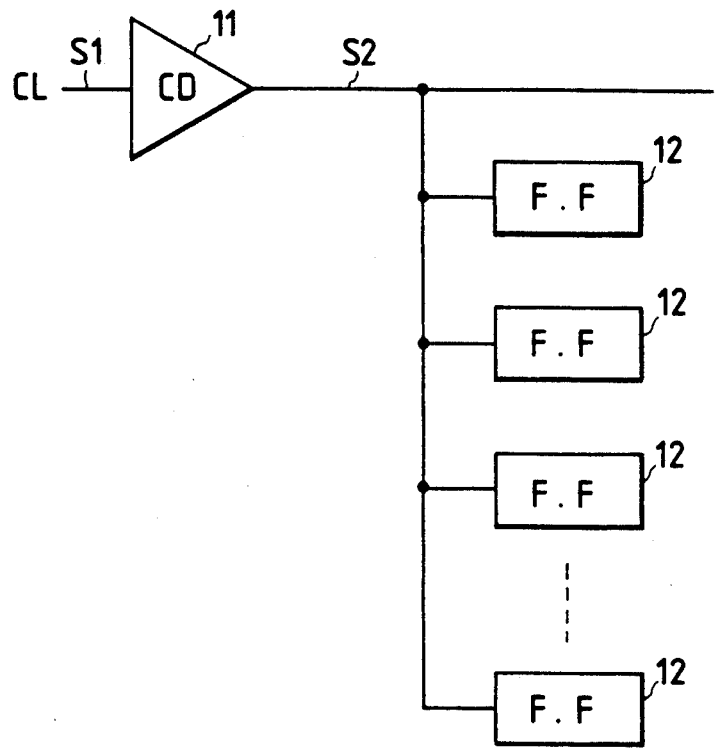
FIG. 4 is a block diagram showing an example of a logic circuit to be installed on the semiconductor integrated circuit device of FIG. 1.

For example, as shown in FIG. 4 (logic block diagram), when a high-frequency logic circuit is installed to a semiconductor integrated circuit having a gate array system, a clock system driver circuit 11 must drive a plurality of flip-flop circuits (logic circuits) 12. Reference clock signal CL from a reference clock generating circuit is inputted through a signal wiring S1 to the clock system driver circuit 11. A drive signal from the clock system driver circuit 11 is inputted through a signal wiring S2 to the plurality of flip-flop circuits 12. In such case, since the signal wiring S1 may have the current capacity sufficient to drive the clock system driver circuit 11, it is formed by one signal wiring 10. On the contrary, since the signal wiring S2 must drive the plurality of flip-flop circuits 12, a large current capacity is required for high speed operation and therefore the signal wiring S2 is formed by a parallel arrangement of two wirings of the signal wiring 10 as shown in FIG. 1.

Figure 7:
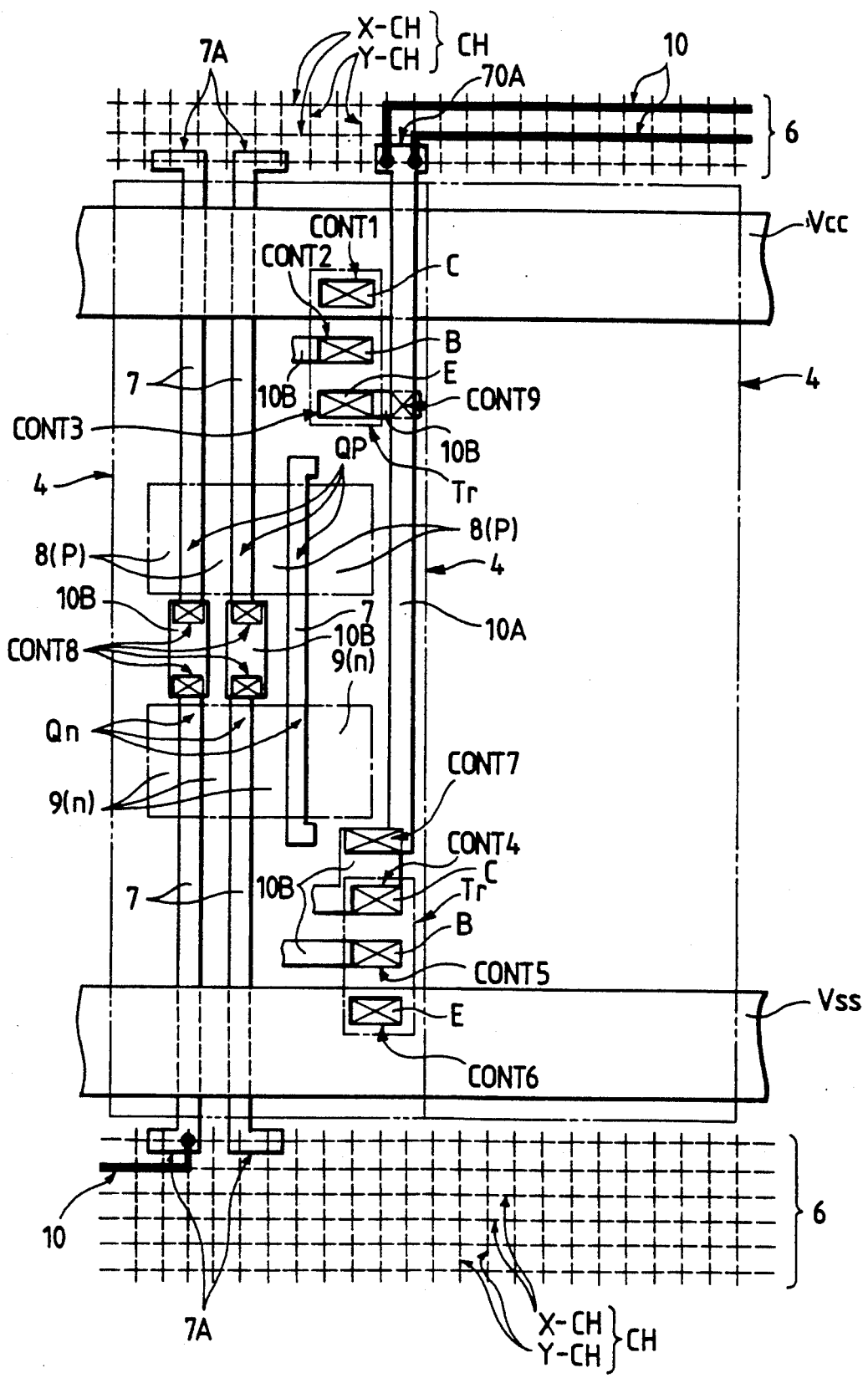
FIG. 7 is a plan view of a main part of a further modified semiconductor integrated circuit device of the invention showing a basic cell and its peripheral region.

FIG. 7 (plan view of main part) shows specific structure of a basic cell as a modification of the invention and a wiring state of the basic cell. The basic cell 4, in similar manner to that shown in FIG. 1, is mainly constituted by two bipolar transistors Tr, three p-channel MISFETs Qp and three n-channel MISFETs Qn. The two bipolar transistors Tr are connected in series between the power source wirings $V_{cc}$ and $V_{ss}$ in aluminum wiring of the first layer. Collector C of the bipolar transistor Tr at the upper side of FIG. 7 is electrically connected to the power source wiring $V_{cc}$ through a connection hole CONT1. Also emitter E of the bipolar transistor Tr at the lower side is electrically connected to the power source wiring $V_{ss}$ through a connection hole CONT6. Emitter E of the bipolar transistor Tr at the upper side is connected through a connection hole CONT3 to a wiring 10B in the cell formed in the aluminum wiring of the first layer, and the wiring 10B is further connected through a connection hole CONT9 to a signal line 10A formed in aluminum wiring of the second layer. The signal line 10A is electrically connected to collector C of the bipolar transistor Tr at the lower side through connection holes CONT7, CONT4. The wiring 10B in the cell is connected through connection holes CONT2, CONT5 to base B of the two bipolar transistors Tr respectively, and base input signal is received by respective transistors Tr. Thus the two bipolar transistors Tr are totem pole type output transistors. Further an output terminal 70A of the output signal line 10A of the output transistors, in similar manner to the terminal 7A shown in FIG. 1, is connected to two signal wirings 10 formed in the aluminum wiring of the first layer extended on the X-Y lattice-shaped wiring channel region CH. Such bipolar transistor has a large load drive capacity and is therefore advantageous, for example, to drive a plurality of logic circuits 12 such as flip-flops simultaneously. In the embodiment, the two signal wirings 10 formed in the aluminum wiring of the first layer are connected to one output terminal 70A formed in the aluminum wiring of the second layer, thereby the substantial current capacity of the output signal wirings (10A, 10) is increased. Consequently, generation of the electromigration is prevented during the large current driving. Also such a construction is suitable for high speed operation of the semiconductor integrated circuit device. In the embodiment, among gate electrodes 7 of the three MISFETs of p and n channels, the gate electrodes 7 of the two MISFETs of p and n channels respectively are installed independently, and electrically connected to each other by the wiring 10 in the cell formed in the aluminum wiring of the first layer through the connection hole CONT8.

Figure 5:
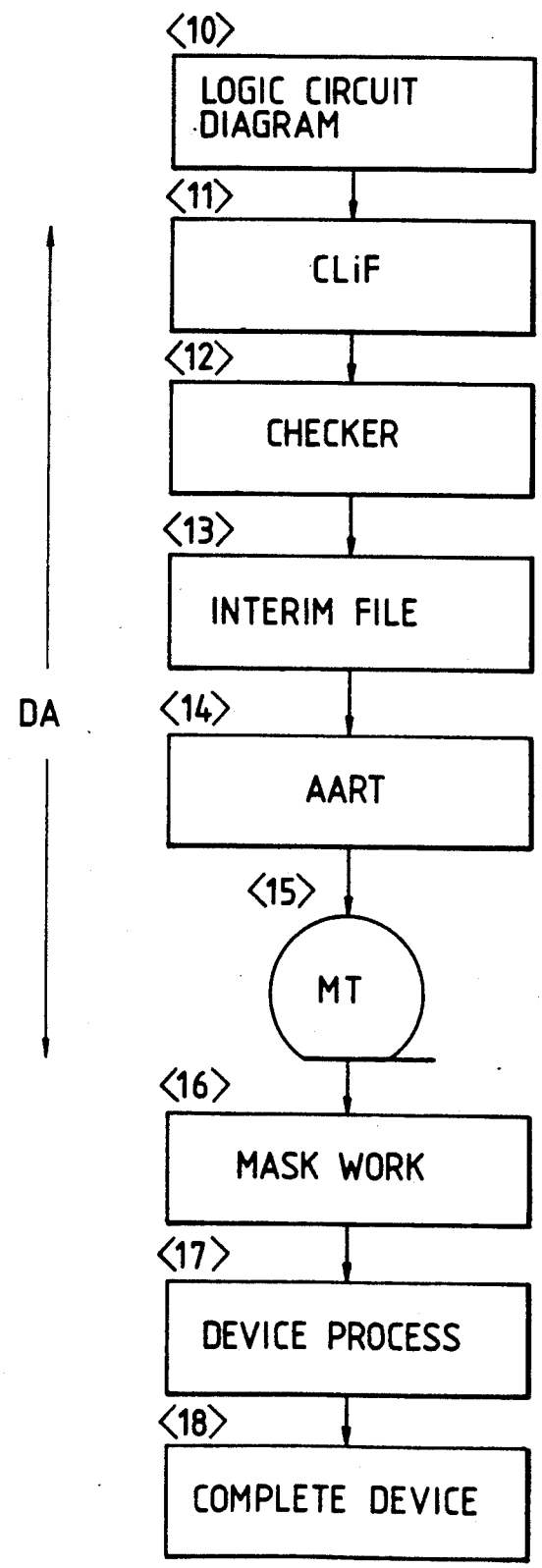
FIG. 5 is a process flow chart illustrating a forming method of the semiconductor integrated circuit device of FIG. 1.

Next, a specific method for forming the semiconductor integrated circuit device 1 adopting the gate array system will be briefly described using FIG. 5 (process flow chart).

First, the logic function to be installed on the semiconductor integrated circuit device having the gate array system is designed, and the logic circuit diagram is prepared <10>.

Next, based on the logic circuit diagram, the logic circuit information, connecting information between the logic circuits, the test pattern information or the like is inputted as the information to be treated in the automatic arrangement and routing system into a file (CLIF: Customer Logic interface Formed) <11>. Among the connecting information between the logic circuits, the signal wiring requiring the large current capacity such as the signal wiring S2 shown in FIG. 4 is inputted in adding the discrimination factor thereto so as to form a plurality of signal wirings.

Based on the information inputted in the file, the logic simulation is carried out and the operation inspection or the like is carried out (checker) <12>.

Information regarding the finishing of the logic simulation is inputted in an interim file <13>.

Based on the information inputted to the interim file, arrangement of the logic circuits and connection between the logic circuits are carried out automatically in the automatic arrangement and routing system (AART)

using the computer <14>. The automatic arrangement and routing system, based on the information inputted to the interim file, arranges the logic circuits (module) along the arrangement of the basic cell patterns of the semiconductor integrated circuit device (base chip) stored in the base data and expressed imaginarily. Also the automatic arrangement and routing system performs connection between the logic circuits by the signal wiring along the X-Y lattice-shaped wiring channel region set in the memory space. That is, the wiring information is automatically inputted to the X-Y lattice-shaped wiring channel region. Then since the signal wiring (S2) requiring the large current capacity is inputted as the wiring information with the discrimination factor added to the interim file, based on the wiring information, connection is made using a plurality of wiring channel regions and a plurality of lattice points. A plurality of signal wirings to constitute the signal wiring having the large current capacity respectively can be connected using the neighboring wiring channel regions in the X-Y lattice-shaped wiring channel region as much as possible to avoid variation in the wiring length.

The wiring information inputted to the X-Y lattice shaped wiring channel region of the automatic arrangement and routing system is converted into mask producing data (MT) <15>. The mask producing data is prepared based on the design rule (device process treating rule).

From step <11> where the information which can be dealt with by the automatic arrangement and routing system is inputted to the file (CLIF) to step <15> where the information is converted into the mask producing data, the information is automatically processed by the design automation (DA).

Based on the mask producing data, a manufacturing mask is formed by an electron beam (EB) drawing device (Mask Work) <16>.

Using the manufacturing mask, a semiconductor wafer manufacturing process (Device Process) is performed on the semiconductor chip 1 <17>, thereby the semiconductor integrated circuit device adopting the gate array system with the prescribed logic function installed thereon is substantially completed (Complete Device) <18>.

In the semiconductor integrated circuit device with the gate array system, the X-Y lattice-shaped wiring channel region set by the automatic arrangement and routing system is constituted by arranging a plurality of wiring channel regions and a plurality of lattice points to the position corresponding to the input/output terminal of the basic cell 4 (or logic circuit), and based on the wiring information inputted to the X-Y lattice-shaped wiring channel region, the signal wiring connecting the basic cells 4 is constituted. Also in the semiconductor integrated circuit device adopting the gate array system, connection between the basic cells 4 (or logic circuits) is performed by the signal wirings 10 with the number of wirings being more than that used in connection between other basic cells 4. In this constitution, since a plurality of signal wirings 10 are connected to the input/output terminal (e.g., the signal terminal 7A) of the basic cell 4 and large current can flow using the plurality of signal wirings 10, the logic circuit can be driven by the large current and the operation speed can be made high, and also the input/output terminal of the basic cells 4 other than the above-mentioned basic cells 4 can be connected by one signal wiring 10 and the number of the signal wirings 10 per unit area can be increased, thereby the mounting efficiency of the logic circuits can be increased and a high integration can be achieved.

The method of forming a semiconductor integrated circuit device 1 adopting the gate array system comprises the step of setting an X-Y lattice-shaped wiring channel region with a plurality of wiring channel regions and a plurality of lattice points arranged at the position corresponding to the input/output terminal of the basic cell 4 onto the memory space of the automatic arrangement and routing system imaginarily; the step <11>, <13> of inputting the wiring information connecting between the basic cells 4 by a signal wiring (S1) and the wiring information connecting between other basic cells 4 by a plurality of signal wirings (S2) into a file to be used in the automatic arrangement and routing system; the step <14> of inputting (generating) wiring information automatically into the X-Y lattice-shaped wiring channel region of the automatic arrangement and routing system, based on the wiring information in the previous step; and the step <17> of forming the signal wiring 10 connecting between the basic cells 4 on the semiconductor chip 1, based on the wiring information inputted (generated) into the X-Y lattice-shaped wiring channel region of the automatic arrangement and routing system. In this method, the signal wiring 10 for connecting between the basic cells 4 (or logic circuits) and the plurality of signal wirings 10 for connecting between other basic cells 4 can be automatically formed. Moreover, the plurality of signal wirings 10 can be easily formed by an ordinary automatic arrangement and routing system by only adding the discrimination factor to the wiring information.

Figure 6:
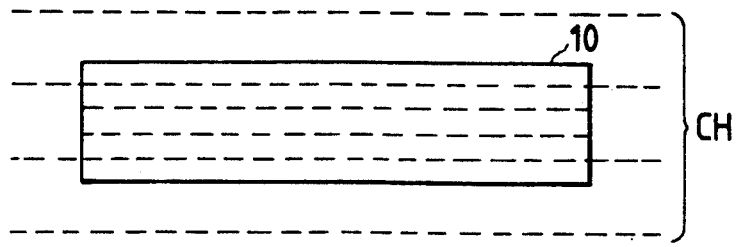
FIG. 6 is a plan view of a main part of a modified semiconductor integrated circuit device of the invention showing signal wiring connecting between basic cells.

The signal wiring 10 having the large current capacity may be formed by integrating two signal wirings 10 arranged at the position corresponding to two neighboring channel regions as shown in FIG. 6 (sectional view of main part). In the integrated signal wiring 10, since the sectional area of the wiring can be increased (thickened) by the amount corresponding to the spaced dimension (wiring pitch) of the two signal wirings 10, large current can flow through it. The integrated signal wiring 10 can be easily formed, for example, in that wiring information is inputted to the X-Y lattice-shaped wiring channel region of the automatic arrangement and routing system and then the process of embedding is applied between the two signal 25 wirings 10.

In the embodiment, although the two Y wiring channels pass though the input/output signal terminal, for example, the signal terminal 7A of the basic cell 4 (or logic circuit) as shown in FIG. 1, in the invention, the signal terminal 7A may be extended in the row direction so that the two X wiring channels pass through it.

The input/output terminal of the basic cell 4 (or logic circuit) may also be formed so that three or more of the signal wirings can be connected thereto.

Although the signal wiring 10 connecting between the basic cells 4 has been mainly described in the embodiment, in addition to this, the invention may be also applied to the signal wiring connecting the input/output buffer circuit 3 and the basic cell 4.

The invention made by the present inventor has been specifically described based on the embodiment. However, the invention is not limited to the embodiment but may be changed variously, of course, without departing from the spirit and scope thereof.

For example, the invention can be applied to a semiconductor integrated circuit device adopting a gate array system having wiring layers of two layers, four layers or more.

The invention can be applied to a semiconductor integrated circuit device with a gate array system of the spreading type where basic cells are spread in matrix form and the basic cells without arrangement of a logic circuit are made a wiring region.

The invention can be applied to a semiconductor integrated circuit device adopting gate array system where a basic cell is constituted by a complementary MISFET or a bipolar transistor.

The invention is not limited to a semiconductor integrated circuit device, but can be applied to a wiring substrate adopting a gate array system.

Effects obtained by the typical invention disclosed in the present invention will be briefly described as follows.

In a semiconductor integrated circuit device adopting a master slice system, the operation speed can be made high and also a high integration can be attained.

The semiconductor integrated circuit device adopting the gate array system can be formed efficiently.

I claim:

1. A master slice type semiconductor integrated circuit device comprising:
   (a) a semiconductor substrate having a main surface;
   (b) a plurality of basic cells formed on said main surface, each said basic cell having input/output (I/O) terminals;
   (c) basic cell arrays, each formed by disposing a plurality of said basic cells in one direction;
   (d) a basic cell matrix formed by disposing said basic cell arrays in a direction substantially perpendicular to said one direction and with wiring forming regions between said basic cell arrays;
   (e) first parallel wiring channel regions extending in said one direction over said wiring forming regions, said first wiring channel regions being imaginarily formed by a computer-aided-design system and being arranged at a predetermined interval;
   (f) second parallel wiring channel regions extending in the direction substantially perpendicular to said one direction over said wiring forming regions, said second wiring channel regions being arranged so that said first and second wiring channel regions form a wiring channel lattice; and
   (g) signal wirings for connecting between said basic cells, formed on said wiring forming regions, and being extended along said wiring channel lattice;
   wherein said wiring channel lattice is arranged so that a plurality of lattice points of said wiring channel lattice correspond to each of said I/O terminals of said basic cells, and wherein for at least one basic cell selected from among said basic cells a plurality of said signal wirings, with respect to the same signal are each connected to a single I/O terminal of said basic cell.

2. A master slice type semiconductor integrated circuit device according to claim 1, wherein at least one of said basic cells selected from among said basic cells includes bipolar transistors and MOS transistors.

3. A master slice type semiconductor integrated circuit device according to claim 2, wherein a composite circuit is constituted by the combination of said bipolar and MOS transistors.

4. A master slice type semiconductor integrated circuit device according to claim 3, wherein said bipolar transistors are comprised of an output stage circuit of said composite circuit, and wherein an output terminal of said output stage circuit corresponds to one of said I/O terminals of said at least one basic cell selected from among said basic cells.

5. A master slice type semiconductor integrated circuit device according to claim 4, further comprising:
   a first operating potential line and a second operating potential line connected to said basic cells, extending along said basic cell array substantially in parallel with said one direction so as to pass respective ones of opposite side of each of said basic cells, wherein said I/O terminals of at least one basic cell selected from among said basic cells project from said opposite peripheries into said wiring channel regions.

6. A master slice type semiconductor integrated circuit device comprising:
   (a) a semiconductor substrate having a main surface;
   (b) a plurality of basic cells formed on said main surface, each of said basic cells having input/output (I/O) terminals;
   (c) basic cell arrays, each formed by disposing a plurality of said basic cells in one direction;
   (d) a basic cell matrix formed by disposing said basic cell arrays in a direction substantially perpendicular to said one direction and with wiring forming regions between said basic cell arrays;
   (e) first generally parallel wiring channel regions extending in said one direction over said basic cell matrix, said first wiring channel regions being imaginarily formed by a computer-aided-design system and being arranged at a predetermined interval;
   (f) second generally parallel wiring channel regions extending in a direction substantially perpendicular to said one direction over said basic cell matrix, said second wiring channel regions being arranged so that said first and second wiring channel regions form a wiring channel lattice;
   (g) signal wirings for connecting between said basic cells, formed on said wiring forming regions, and being extended along said wiring channel lattice;
   wherein said wiring channel lattice is arranged so that a plurality of lattice points of said wiring channel lattice correspond to each of said I/O terminals of said basic cells, and wherein for at least one basic cell selected from among said basic cells a plurality of said signal wirings, with respect to the same signal are each connected to a single I/O terminal of said basic cell.

* * * * *